United States Patent [19]

Yanaka et al.

[11] Patent Number: 5,067,008
[45] Date of Patent: Nov. 19, 1991

[54] IC PACKAGE AND IC CARD INCORPORATING THE SAME THEREINTO

[75] Inventors: Yoshimi Yanaka, Toride; Keiji Miyamoto, Ibaraki, both of Japan

[73] Assignee: Hitachi Maxell, Ltd., Osaka, Japan

[21] Appl. No.: 563,628

[22] Filed: Aug. 7, 1990

[30] Foreign Application Priority Data

Aug. 11, 1989 [JP] Japan .................................. 1-209360

[51] Int. Cl.$^5$ ............................................. H01L 23/02
[52] U.S. Cl. ........................................ 357/81; 357/80; 357/72; 357/14; 357/77
[58] Field of Search ...................... 357/72, 84, 80, 81, 357/77, 74; 235/272.17, 492, 441; 264/272.17

[56] References Cited

U.S. PATENT DOCUMENTS

| | | | |
|---|---|---|---|
| 3,381,071 | 4/1968 | Logan et al. | 357/80 |
| 4,822,989 | 4/1990 | Miyamoto et al. | 357/80 |
| 4,825,282 | 4/1989 | Fukaya | 357/81 |
| 4,954,308 | 9/1990 | Yabe et al. | 264/272.17 |

FOREIGN PATENT DOCUMENTS 0231937 8/1987 European Pat. Off. .

OTHER PUBLICATIONS

Patent Abstracts of Japan, vol. 9, no. 325 (E-368) (2048), Dec. 20, 1985; and JP-A-jo-157 241 (Mitsubishi) 18-[-1985.

Patent Abstracts of Japan, vol. 12, no. 65 (E-586) (2912), Feb. 27, 1988; and JP-A-62-208 651 (Mitsubishi) 12-09-1987.

*Primary Examiner*—Andrew J. James
*Assistant Examiner*—T. Davenport
*Attorney, Agent, or Firm*—Birch, Stewart, Kolasch, & Birch

[57] ABSTRACT

An IC package comprising an integrated substrate which includes a cavity, in which an IC chip is mounted, formed by a wall surrounding the IC chip, and a groove formed in the surrounding wall extending to surround and communicate with the cavity and method for fabricating the IC package, wherein an excessive amount of resin is filled in the cavity of the integrated substrate, and the composite structure pressed by a plate whereby the excess of the resin overflows from the cavity pressure to be received in the groove such that, the exposed surface of the filled resin is formed into a predetermined shape without requiring grinding.

13 Claims, 5 Drawing Sheets

IC PACKAGE AND IC CARD INCORPORATING THE SAME THEREINTO

BACKGROUND OF THE INVENTION

1. Field of the Invention

The present invention relates to an IC (integrated circuit) package and also to an IC card incorporated.

2. Discussion of the Related Art

In the production of a conventional IC package a surrounding wall is placed on an IC package substrate to define therebetween a cavity. An IC chip is placed within the cavity of the IC package substrate. A wire bonding is provided between the IC chip and terminals. A excess amount of a liquid viscous resin material is filled into the cavity by potting. Examples of such a liquid viscous resin material include an epoxy resin and a silicone resin. After the resin is cured or set, the excess of the resin is removed by grinding, thereby adjusting the flatness and thickness of the IC package.

However, recently, to meet the requirement for saving power consumption of an IC package and the requirement for compactness of the IC package, the IC package substrate, as well as the potted resin, has become thinner. As a result, there have been encountered problems, such as the generation of stresses in the IC chip and disconnection of bonding of gold wires because of the grinding operation.

SUMMARY OF THE INVENTION

It is therefore an object of this invention to provide an IC package requiring no grinding operation.

According to the present invention, there is provided an IC package comprising:
an integrated circuit chip;
a substrate on which the integrated circuit chip is mounted;
a wall for surrounding the integrated circuit chip, the surrounding wall being placed on the substrate to define therebetween a cavity in which the integrated circuit chip is mounted on the substrate;
recess means provided in the surrounding wall, the recess means communicating with the cavity; and
a resin which fills the cavity and recess for sealing the integrated circuit chip therein.

According to the present invention, when an excessive amount of resin is filled in the IC package, the excess of resin which does not contribute to the plastic-sealing of the IC chip spills over into the recess means. Therefore, without the use of a grinding operation, there can be produced an IC package having a degree of flatness and a high precisely controlled thickness. Since the grinding operation is not needed, the above-mentioned problems are not encountered, and the IC package can be produced at lower costs with a higher yield.

Preferably, the capacity of the recess means is substantially equal to a volume corresponding to a difference between the maximum volume of the resin to be filled and a volume of the resin required for the potting, and the capacity of the recess means is not more than 10% of the maximum volume of the resin to be filled.

Other objects, operation and features of the present invention will become apparent to those skilled in the art upon making reference to the following detailed description of the preferred embodiments and the accompanying drawings.

DETAILED DESCRIPTION OF THE INVENTION

Figure 1:
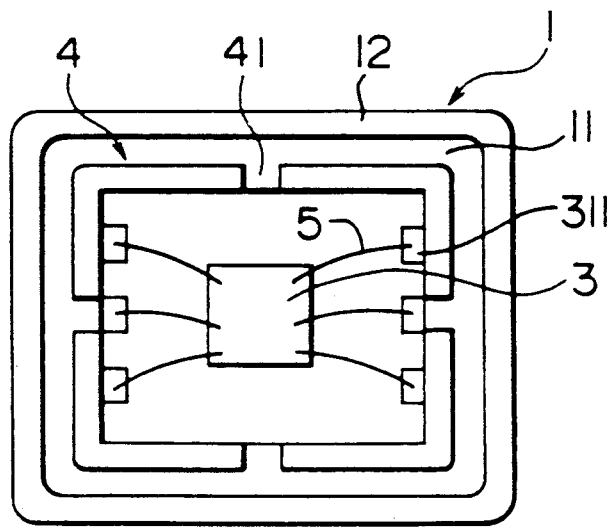
FIG. 1 is a top plan view of an integrated substrate to be used in an IC package according to one embodiment of the present invention.
Figure 2:
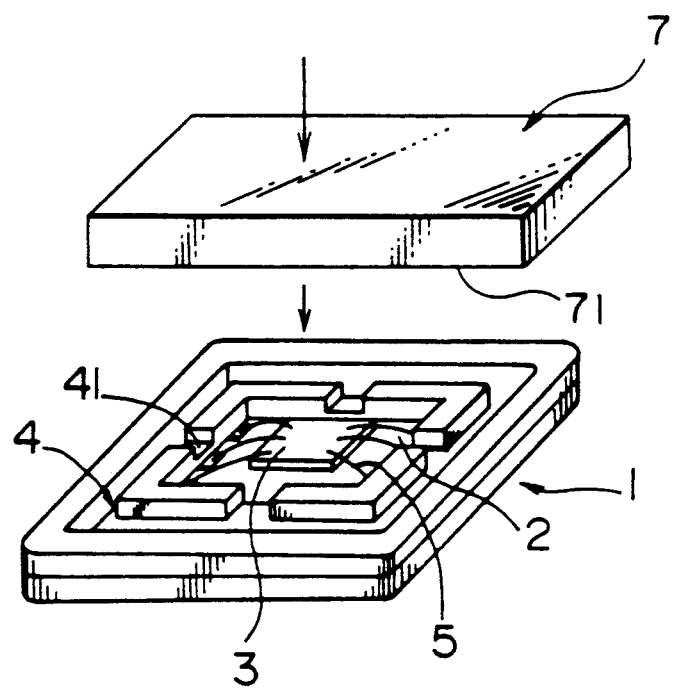
FIG. 2 is a view illustrative of a method of producing an IC package incorporating therein the substrate shown in FIG. 1.

Referring to FIG. 1, a substrate 11 for an IC (integrated circuit) package has a rectangular shape (7 mm×9 mm). A surrounding wall 12 is mounted on the substrate 11 so as to define therebetween a cavity 2. The substrate 11 and the surrounding wall 12 are made of epoxy resin with a glass fiber filler, integrated into an integrated substrate 1. The integrated substrate 1 has a thickness of 0.8 mm. The surrounding wall 12 has a continuous groove 4 therein extending to surround the cavity 2. The groove 4 has a width of 0.2 mm and a depth of from 0.1 mm to 0.2 mm. The groove 4 communicates with the cavity 2 through four communication passages 41. The groove 4 and passages 41 comprise together a resin means.

A method of forming a package for an IC card using the integrated substrate 1 of FIG. 1 will now be described with reference to FIGS. 2 to 4 and 10.

First, the IC chip 3 is placed at a central portion of the substrate 11. The substrate 11 incorporates a wiring board 31 (FIG. 10) having lead terminals 311 and input-/output terminals 312, both of which terminals 311 and 312 are electrically connected with each other through communication holes 313 formed in the substrate 11. The IC chip 3 is connected or wire-bonded with the lead terminals 311 through gold wires 5, as shown in FIG. 10.

Then, the cavity 2 is filled with a viscous resin material 6 (for example, epoxy resin or silicone resin) in a liquid state in an amount in excess of the volume of the cavity 2. Subsequently, a pressure plate 7 is abutted at its flat smooth surface 71 against the resin 6, and is pressed against the integrated substrate 1. The excess of the resin 6 overflows from the cavity 2 into the groove 4 via the communication passages 41. Then, an ultraviolet ray is applied to set or cure the resin 6. After the resin 6 is completely cured, the pressure plate 7 is released from the integrated substrate 1.

Figure 10:
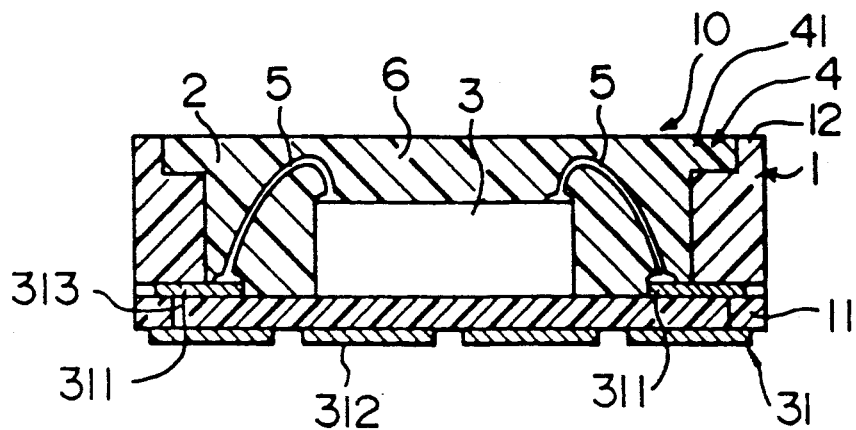
FIG. 10 is a cross-sectional view showing an IC package incorporating therein the substrate shown in FIG. 1.

With this method, an IC package 10 can be obtained, in which the exposed surface of the cured resin 6 is formed to a high degree of flatness, without grinding (FIG. 10).

Figure 11:
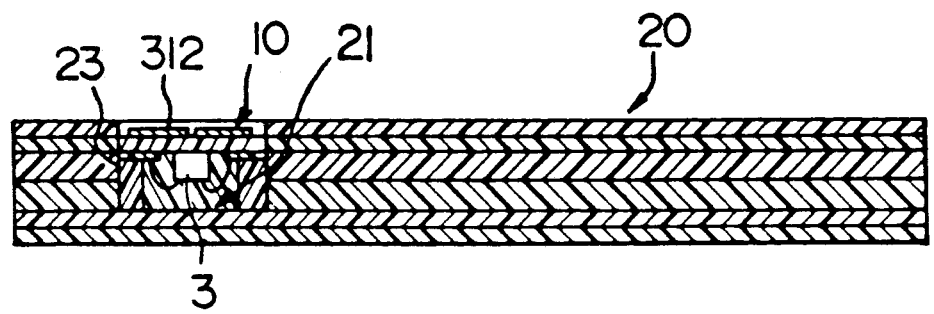
FIG. 11 is a cross-sectional view showing an IC card incorporated into the IC package shown in FIG. 10.
Figure 12:
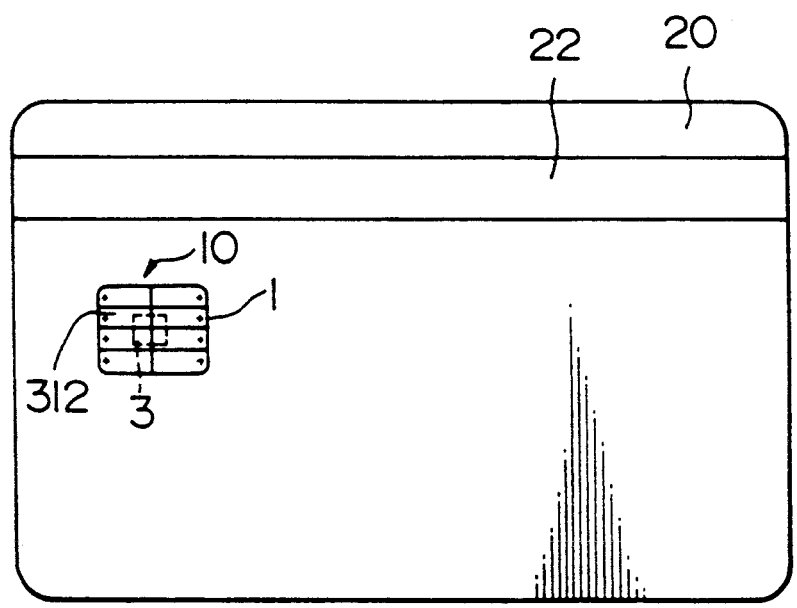
FIG. 12 is a plan view showing the IC card shown in FIG. 11.

In the case whereby the IC package 10 thus produced according to the above-mentioned procedure is incorporated into an IC card, a card body 20 of a multilayer laminate is provided at first, shown in FIGS. 11 and 12. The card body 20 is provided with a recess 21 for the IC package 10 and on one end surface thereof with a magnetic strip 22. An adhesive 23, for example an epoxy resin, is applied to an inner periphery of the recess 21 of the card body 20 and the IC package 10 is inserted into the recess 21 such that the input/output terminals 312 are located to be facing outward. Subsequently, pressure is applied to the IC card body 20 under a mositened condition to cure the adhesive 23 to produce the IC card.

In this embodiment, in order to facilitate the release of the pressure plate 7 from the substrate 1, the pressure plate 7 is made of polytetrafluoroethylene. However, any other suitable material which facilitates this release can be used. For example, the press plate 7 may comprise a glass plate coated with silicone. Also, the abutment surface 71 of the pressure plate 7 may be satin finished or corrugated, instead of flat and smooth one. In this case, an anchor effect of an adhesive can be enhanced when bonding the package to a mating device or element.

The effective capacity of the groove 4 and passages 41 is substantially equal to a volume corresponding to a difference between the maximum volume of the resin to be filled and a volume of the resin required for the potting. In this embodiment, the effective capacity of the groove 4 and passages 41 is substantially equal to 10% of the volume of the resin filled, which volume is about 30 mg.

Figure 3:
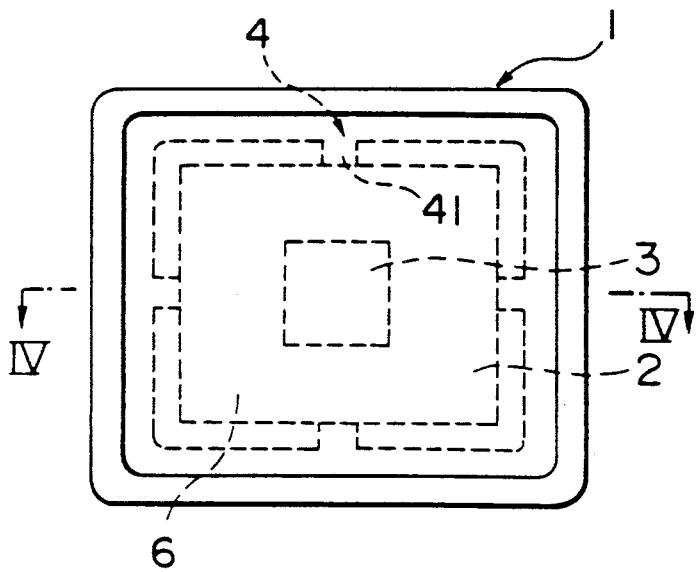
FIG. 3 is a top plan view of the integrated substrate of FIG. 1 subjected to potting with a resin.
Figure 4:
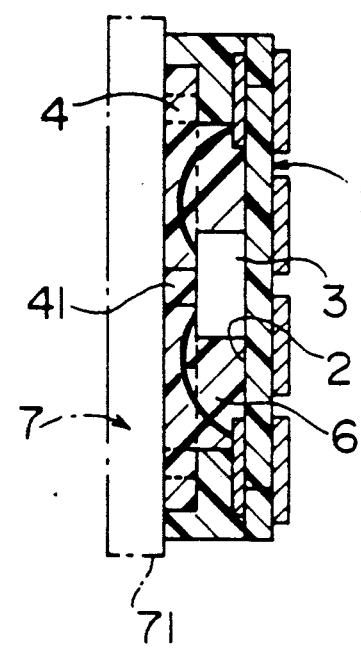
FIG. 4 is a cross-sectional view taken along the line IV—IV of FIG. 3.
Figure 5:
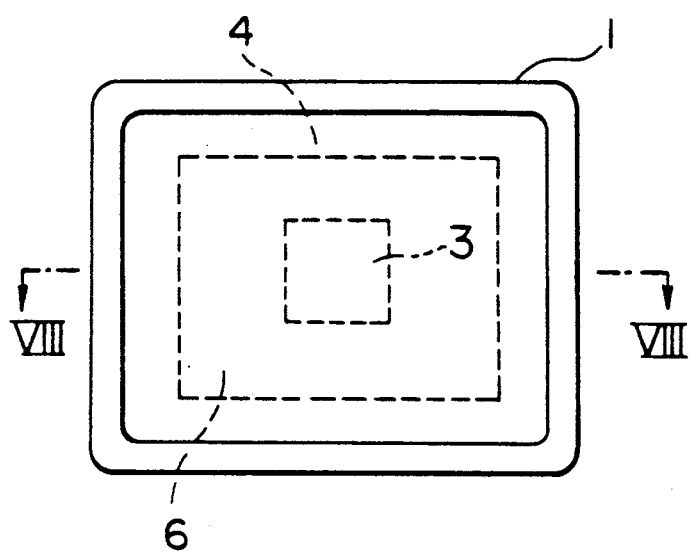
FIGS. 5, 6 and 7 are top views showing modified integrated substrates used in other embodiments of the present invention, respectively.
Figure 8:
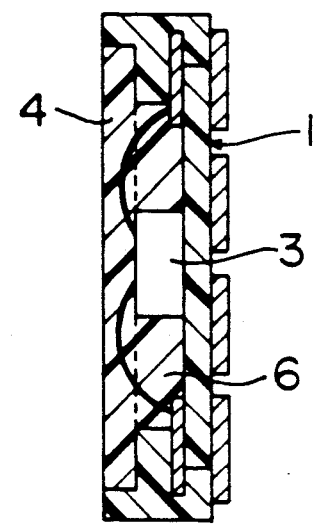
FIGS. 8 and 9 are cross-sectional views taken along the line VIII—VIII of FIG. 5 and the line IX—IX of FIG. 7, respectively.

FIGS. 5 and 8 show another embodiment of the invention which differs from the embodiment of FIGS. 3 and 4 only in that the inner peripheral surface of the groove 4 is expanded or extended to the outer periphery of the cavity 2.

Figure 6:
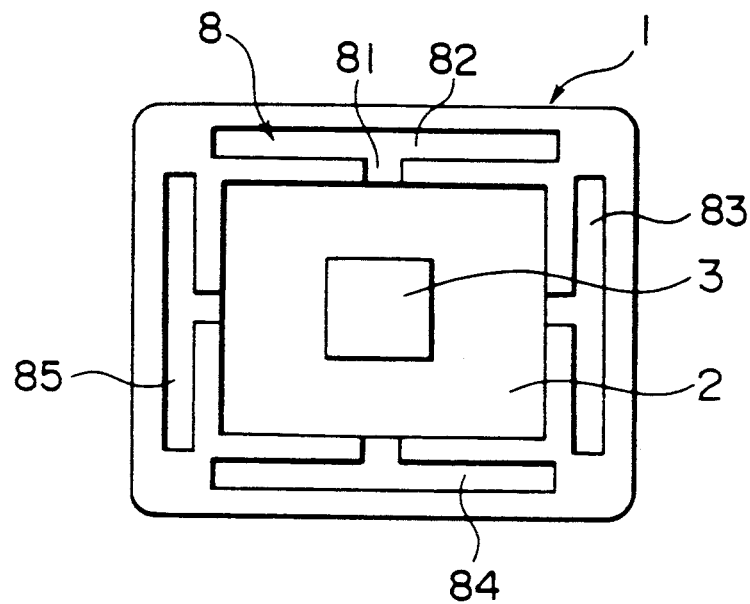

FIG. 6 shows a further embodiment of the invention. In this embodiment, groove means 8 is composed of four discontinuous groove portions 82 to 85 disposed to surround the cavity 2. Each of the groove portions 82 and 85 communicates with the cavity 2 through a respective one of communication passages 81.

Figure 7:
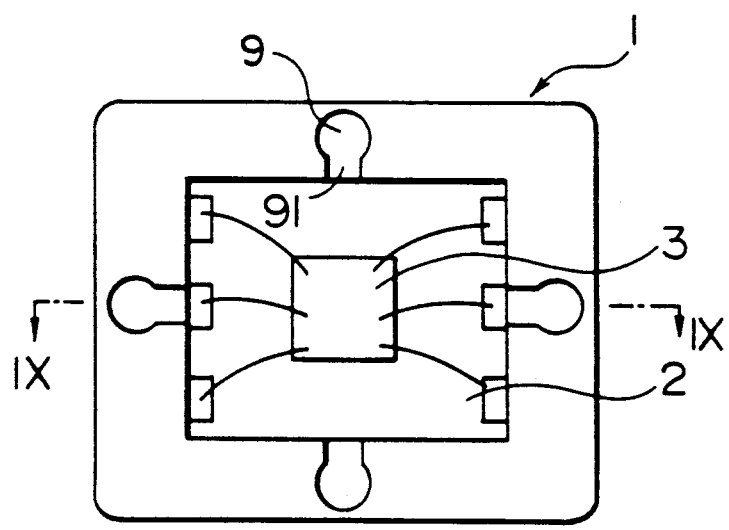
Figure 9:
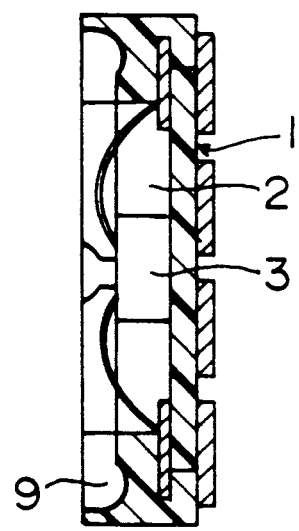

In a further embodiment shown in FIGS. 7 and 9, instead of the groove, a plurality of dimples 9 are formed in the surrounding wall 12. Each of the dimples 9 communicates with the cavity 2 through a respective one of the communication passages 91.

These modified substrates achieve similar effects achieved by the substrate of FIG. 1. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An IC package comprising:
   an integrated circuit chip;
   a substrate on which said integrated circuit chip is mounted;
   a wall for surrounding said integrated circuit chip provided on said substrate to define therebetween a cavity;
   recess means provided in said surrounding wall for communicating with said cavity; and
   resin for filling said cavity and said recess means for sealing said integrated circuit chip.

2. An IC package according to claim 1, wherein a difference between a volume of resin to be filled into said cavity and a maximum desire volume of resin to be filled is less than 10% of said maximum desired volume of resin to be filled.

3. An IC package according to claim 1, wherein an effective capacity of said recess means is substantially equal to a volume corresponding to a difference between a maximum volume of filled resin and a volume of resin to be potted.

4. An IC package according to any one of claims 1, 2 and 3, wherein said recess means includes either one continuous groove or a multiplicity of grooves surrounding said integrated circuit chip.

5. An IC package according to any one of claims 1, 2 and 3, wherein said recess means includes a plurality of dimples.

6. An IC card comprising:
   an IC card body provided with a recess portion; and
   and IC package fixed into said recess portion of said IC card body, said IC package including,
   an integrated circuit chip;
   a substrate on which said integrated circuit chip is mounted;
   a wall for surrounding said integrated circuit chip provided on said substrate to define therebetween a cavity;
   recess means provided in said surrounding wall for communicating with said cavity; and
   resin for filling said cavity and said recess means for sealing said integrated circuit chip.

7. An IC card according to claim 6, wherein a difference between a volume of resin to be filled into said cavity and a maximum desired volume of resin to be filled is less than 10% of said maximum desired volume of resin to be filled.

8. An IC card according to claim 6, wherein an effective capacity of said recess means is substantially equal to a volume corresponding to a difference between a maximum volume of filled resin and a volume of resin to be potted.

9. An IC card, according to any one of claims 6, 7 and 8, wherein said recess means includes either one continuous groove or a multiplicity of grooves surrounding said integrated circuit chip.

10. An IC card according to any one of claims 6, 7 and 8, wherein said recess means includes a plurality of dimples.

11. An IC card according to claim 6, wherein said IC package is fixed to said IC card body by an adhesive layer.

12. An IC package according to claim 1, wherein said recess means includes a groove in said wall surrounding said integrated circuit chip and passages for communicating with said cavity.

13. An IC card according to claim 6, wherein said recess means of said IC package includes a groove in said wall surrounding said integrated circuit chip and passages for communicating with said cavity.

* * * * *